(12) United States Patent
Jung

(10) Patent No.: US 8,283,242 B2
(45) Date of Patent: Oct. 9, 2012

(54) METHOD OF REMOVING PHOTORESIST

(75) Inventor: Tae-Woo Jung, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 0 days.

(21) Appl. No.: 12/707,602

(22) Filed: Feb. 17, 2010

(65) Prior Publication Data

US 2010/0159682 A1    Jun. 24, 2010

Related U.S. Application Data

(62) Division of application No. 11/646,404, filed on Dec. 28, 2006, now abandoned.

(30) Foreign Application Priority Data

| Jul. 4, 2006 | (KR) | .......................... 10-2006-0062656 |
| Sep. 19, 2006 | (KR) | .......................... 10-2006-0090811 |

(51) Int. Cl.
   *H01L 21/26* (2006.01)
(52) U.S. Cl. .......................... 438/513; 438/725; 438/689
(58) Field of Classification Search .................. 438/513, 438/725, 689
   See application file for complete search history.

(56) References Cited

U.S. PATENT DOCUMENTS

| 5,578,163 | A | 11/1996 | Yachi |
| 5,824,604 | A | 10/1998 | Bar-Gadda |
| 6,352,936 | B1 | 3/2002 | Jehoul et al. |
| 2002/0119677 | A1 | 8/2002 | Soda et al. |
| 2003/0114010 | A1 | 6/2003 | Jung |
| 2003/0207563 | A1 | 11/2003 | Smith et al. |
| 2004/0084150 | A1 | 5/2004 | George et al. |
| 2005/0215050 | A1* | 9/2005 | Smith et al. ................... 438/622 |
| 2006/0270172 | A1* | 11/2006 | Wang et al. ................... 438/301 |
| 2007/0243700 | A1* | 10/2007 | Qin et al. ....................... 438/513 |
| 2007/0281492 | A1 | 12/2007 | Chinn et al. |

FOREIGN PATENT DOCUMENTS

| CN | 1647257 | 7/2005 |
| CN | 1682353 | 10/2005 |
| JP | 07-193045 | 7/1995 |
| JP | 2001-308078 | 11/2001 |
| JP | 2002-261092 | 9/2002 |
| JP | 2002-353196 | 12/2002 |
| JP | 2006-073796 | 3/2006 |
| JP | 2006-128148 | 5/2006 |
| KR | 1994-0024912 | 11/1994 |
| KR | 1998-055736 | 9/1998 |
| KR | 10-2001-0008574 | 2/2001 |

(Continued)

OTHER PUBLICATIONS

Office Action dated Apr. 26, 2007, for Korean application No. 10-2006-0062656, citing the above references.

(Continued)

*Primary Examiner* — Jae Lee
(74) *Attorney, Agent, or Firm* — Lowe Hauptman Ham & Berner, LLP

(57) ABSTRACT

A method includes forming a photoresist pattern over a certain portion of a material layer to expose an ion implantation region, implanting impurities in the ion implantation region of the material layer using the photoresist pattern as an ion implantation barrier, and removing the photoresist pattern using plasma of a gas mixture including a hydrocarbon-based gas.

24 Claims, 15 Drawing Sheets

FOREIGN PATENT DOCUMENTS

| | | |
|---|---|---|
| KR | 10-0319343 | 2/2002 |
| KR | 10-2006-0076087 | 7/2006 |
| WO | 2006028858 | 3/2006 |

OTHER PUBLICATIONS

Office Action dated Sep. 11, 2009, for Chinese application No. 200710111114.3, citing the above references.

Chinese Patent Publication for publication No. 101101457, citing the above reference(s).

Taiwanese Office Action for 095149668 dated May 25, 2011, citing the above reference(s).

Japanese Office Action for 2007-048547 dated Feb. 14, 2012, citing the above reference(s).

* cited by examiner

FIG. 7A

| CLASSIFICATION | 3 TIMES OF ION IMPLANTATION | | | |
|---|---|---|---|---|
| | DI/O₃ (25°C) | | DI/O₃ (80°C) | |
| PRE-TREATMENT | | | | |
| AFTER 3 TIMES OF IMPLANTATION | | | | |
| AFTER DI/O₃ TREATMENT | N/A | N/A | | |
| AFTER 1st PR REMOVAL | | | | |
| AFTER 2nd PR REMOVAL | | | | |
| RESIDUE EXISTENCE | RESIDUE FREE | | RESIDUE FREE | |

FIG. 7B

| CLASSIFICATION | 3 TIMES OF ION IMPLANTATION (1.5 × 10¹⁶, B) | |
|---|---|---|
| PRE-TREATMENT | Room Temp DI/O₃ (25°C) | DI/O₃ SKIP |
| AFTER 3 TIMES OF IMPLANTATION | | |
| AFTER DI/O₃ TREATMENT | N/A | N/A |
| AFTER PR REMOVAL | | STEP1: 1700mT/ 4000O2/400H2N2/Middle 5"<br>STEP2: 1700mT/2000W/4000O2/400H2N2/Middle 60"<br>STEP3: 1700mT/2000W/4000O2/400H2N2/Down 50"<br>STEP4: 1700mT/2000W/ 0O2/400H2N2/Down 20" |
| AFTER CLN | | |
| RESIDUE EXISTENCE | RESIDUE FREE | RESIDUE FREE |

FIG. 7C

| CLASSIFICATION | PLAD SCHEME (2.5 × 10$^{16}$) | | | |
|---|---|---|---|---|
| PRE-TREATMENT | ROOM TEMP DI/O$_3$ (25°C) | | HOT TEMP DI/O$_3$ (80°C) | |
| AFTER PLAD PROCESS | | | | |
| AFTER DI/O$_3$ TREATMENT | | | | |
| AFTER 1st PR REMOVAL | | | | |
| AFTER 2nd PR REMOVAL | | | | |
| RESIDUE EXISTENCE | RESIDUE EXIST | | RESIDUE FREE | |

FIG. 7D

| CLASSIFICATION | PLAD SCHEME ($3.0 \times 10^{16}$, B) | | | |
|---|---|---|---|---|
| PRE-TREATMENT | ROOM TEMP DI/O$_3$ (25°C) | | DI/O$_3$ SKIP | |
| AFTER PLAD PROCESS | | | | |
| AFTER DI/O$_3$ TREATMENT | | | | |
| AFTER PR REMOVAL | | | | |
| AFTER CLN | | | | |
| RESIDUE EXISTENCE | RESIDUE FREE | | RESIDUE GENERATION | |

METHOD OF REMOVING PHOTORESIST

CROSS REFERENCE TO RELATED APPLICATION

This application is a divisional of U.S. Ser. No. 11/646,404, filed on Dec. 28, 2006. This application, in its entirety, is incorporated herein by reference.

CROSS REFERENCE TO RELATED APPLICATIONS

The present application claims priority to Korean patent applications Nos. KR 2006-62656 and KR 2006-90811, filed in the Korean Patent Office on Jul. 4, 2006 and Sep. 19, 2006, respectively, the entire contents of which is hereby incorporated herein by reference thereto.

BACKGROUND OF THE INVENTION

1. Field of the Invention

The present invention relates to a method for fabricating a semiconductor device, and more particularly, to a method of removing a photoresist layer.

2. Brief Description of the Related Art

A typical ion implantation process utilizes a photoresist layer as an ion implantation mask when fabricating a semiconductor device. For instance, a dual poly gate process uses a photoresist layer as an ion implantation mask.

FIGS. 1A to 1C are cross-sectional views showing a typical dual poly gate process.

Referring to FIG. 1A, a substrate 11 is defined into an N-channel metal-oxide semiconductor (NMOS) region and a P-channel metal-oxide semiconductor (PMOS) region. A device isolation structure 12 is formed in the substrate 11. A gate oxide layer 13 is formed over the substrate 11 and the device isolation structure 12. A gate polysilicon layer 14A and an N-type doped polysilicon layer 14 are formed over the gate oxide layer 13. In more detail, a gate polysilicon material layer is formed over the gate oxide layer 13. N-type impurities are implanted into a portion of the gate polysilicon material layer in the NMOS region by an ion implantation process $N^+$ IMP using a first photoresist pattern 15 to form the N-type doped polysilicon layer 14A. The first photoresist pattern 15 exposes the NMOS region and covers the PMOS region. A remaining portion of the gate polysilicon material layer in the PMOS region is referred to as the gate polysilicon layer 14.

Referring to FIG. 1B, the first photoresist pattern 15 is removed. A photoresist layer is formed over the resultant substrate structure. The photoresist layer is patterned by performing photo-exposure and developing processes to form a second photoresist pattern 16. The second photoresist pattern 16 exposes the PMOS region and covers the NMOS region. P-type impurities are implanted into the gate polysilicon layer 14 in the PMOS region by an ion implantation process $P^+$ IMP using the second photoresist pattern 16 to form P-type doped polysilicon layer 14B.

Referring to FIG. 1C, the second photoresist pattern 16 is removed. Tungsten silicide layers 17 are formed over the resultant substrate structure. A gate patterning process is performed onto the substrate structure to form an $N^+$ poly gate 14C in the NMOS region and a $P^+$ poly gate 14D in the PMOS region. The $N^+$ poly gate 14C includes N-type doped polysilicon and the $P^+$ poly gate 14D includes P-type doped polysilicon.

In the aforementioned typical method, different impurities, i.e., phosphorus (P) and boron (B), are implanted into the gate polysilicon material layer to embody a dual poly gate configured with the $N^+$ poly gate 14C and the $P^+$ poly gate 14D. The impurities are implanted using a high density ion implantation process at high dose ranging from approximately $1 \times 10^{15}$ $cm^{-2}$ to approximately $1 \times 10^{16}$ $cm^{-2}$. In the typical method, a gas including oxygen and nitrogen ($O_2/N_2$ chemistry) is used to remove the first and the second photoresist patterns 15 and 16 after the ion implantation process is performed.

However, the high density ion implantation process at high dose causes substantial hardening of the first and the second photoresist patterns 15 and 16. Thus, the first and the second photoresist patterns 15 and 16 may not be removed easily. Photoresist residues may remain after the removal of the first and the second photoresist patterns 15 and 16. The oxygen ($O_2$) used during the removal of the first and the second photoresist patterns 15 and 16 reacts with impurities existing in the first and the second photoresist patterns 15 and 16, i.e., arsenic (As), phosphorus (P), and boron (B), to form an impurity oxide layer, e.g., $As_2O_3$, $P_4O_6$, and $B_2O_3$, covering surfaces of the first and the second photoresist patterns 15 and 16.

Thus, abnormal oxidation may occur in the tungsten silicide layers 17 during a subsequent process due to the remaining photoresist residues. Also, an interface defect may occur between the poly gates and the tungsten silicide layers may generate a source of lifting or particle after the gate patterning is performed. Photoresist may not be completely removed when a doping level of an ion implantation process is high. The process time lengthens in order to remove the remaining photoresist, and thus, mass-producibility decreases.

FIG. 1D is a micrographic view of photoresist residues generated by the typical method.

SUMMARY OF THE INVENTION

The present invention provides a method for easily removing a photoresist layer used during an ion implantation process at high dose, without generating residues.

In accordance with a first aspect of the present invention, there is provided a method, including: forming a photoresist pattern over a certain portion of a material layer to expose an ion implantation region; implanting impurities in the ion implantation region of the material layer using the photoresist pattern as an ion implantation barrier; and removing the photoresist pattern using a plasma of a gas mixture including a hydrocarbon-based gas.

In accordance with another aspect of the present invention, there is provided a method, including: forming a photoresist pattern over a certain portions of a material layer to expose an ion implantation region; implanting impurities in the ion implantation region of the material layer using the photoresist pattern as an ion implantation barrier; and removing the photoresist pattern using a plasma of a gas mixture including diimide ($N_2H_2$).

In accordance with still another aspect of the present invention, there is provided a method, including: forming a first photoresist pattern over a polysilicon layer, the first photoresist pattern exposing a first portion of the polysilicon layer; implanting first impurities into the first portion of the polysilicon layer using the first photoresist pattern as an ion implantation barrier; removing the first photoresist pattern using a plasma of a gas mixture including diimide ($N_2H_2$); forming a second photoresist pattern over the polysilicon layer, the second photoresist pattern exposing a second portion of the polysilicon layer other than the first portion; implanting second impurities into the second portion of the polysilicon layer using the second photoresist pattern as an ion implantation barrier; and removing the second photoresist pattern using a plasma of a gas mixture including $N_2H_2$.

BRIEF DESCRIPTION OF THE DRAWINGS

FIGS. 7A to 7D are micrographic views showing results of a photoresist layer removal process according to usage and non-usage of a DI/$O_3$ rinse treatment.

DETAILED DESCRIPTION OF THE EMBODIMENTS

FIGS. 2A to 2D are cross-sectional views showing a method for removing a photoresist layer consistent with a first embodiment of the invention. Hereinafter, the photoresist layer removal process refers to a removal method performed after a dual poly gate process.

Figure 1A:
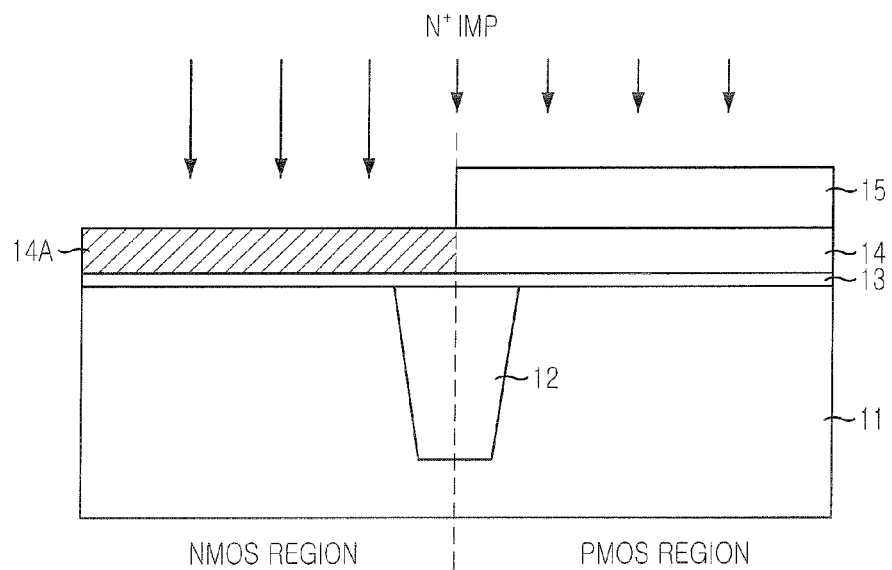
FIGS. 1A to 1C are cross-sectional views of a typical dual poly gate process.
Figure 1B:
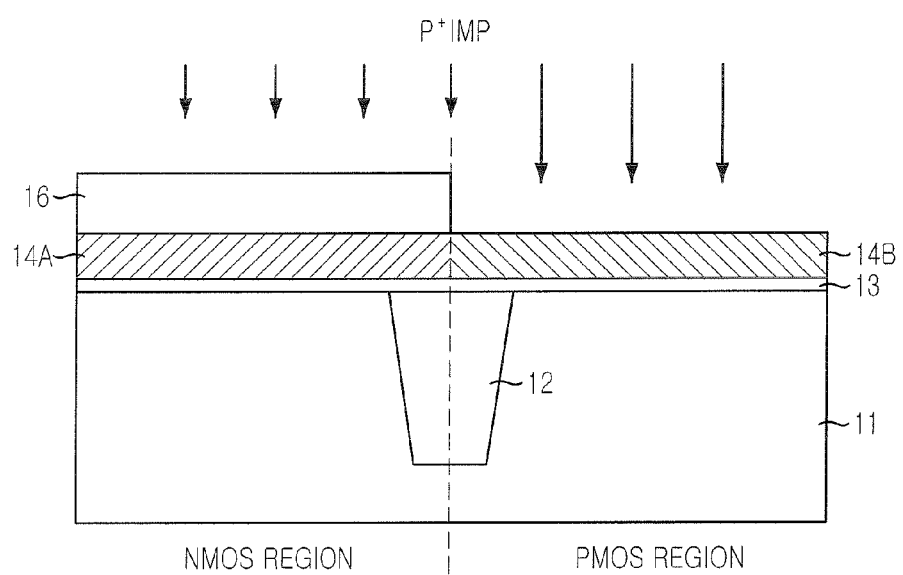
Figure 1C:
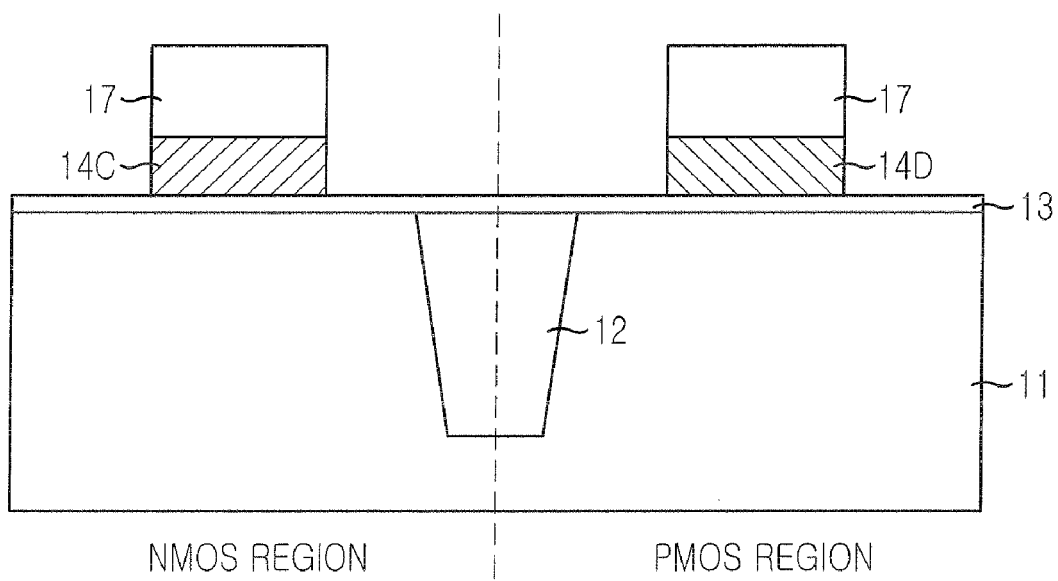
Figure 1D:
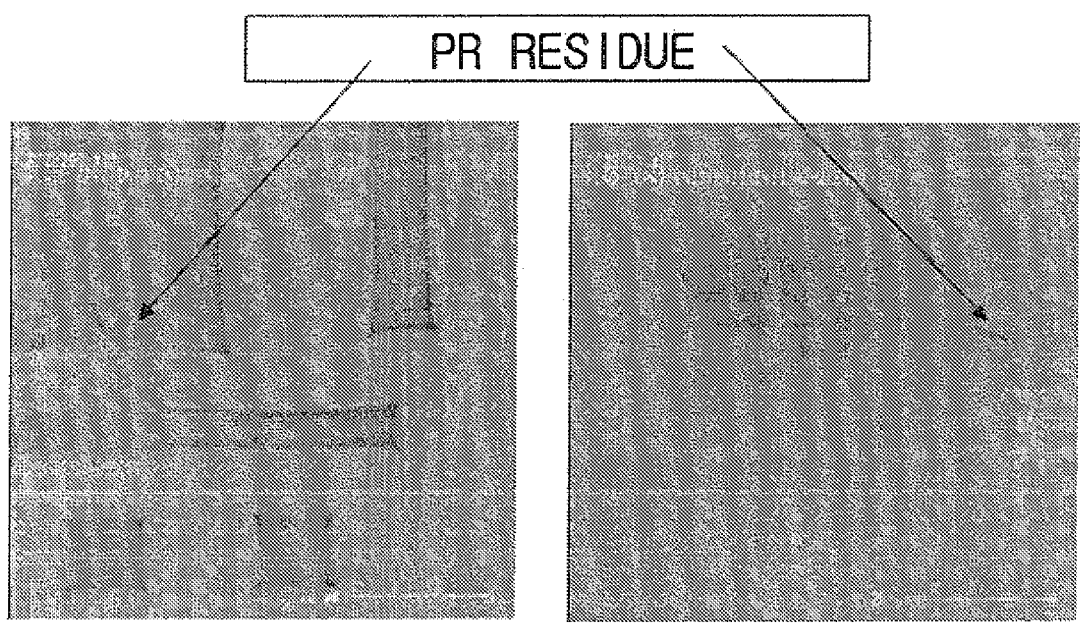
FIG. 1D is a micrographic view of photoresist residues generated by the above described typical prior art method.
Figure 2A:
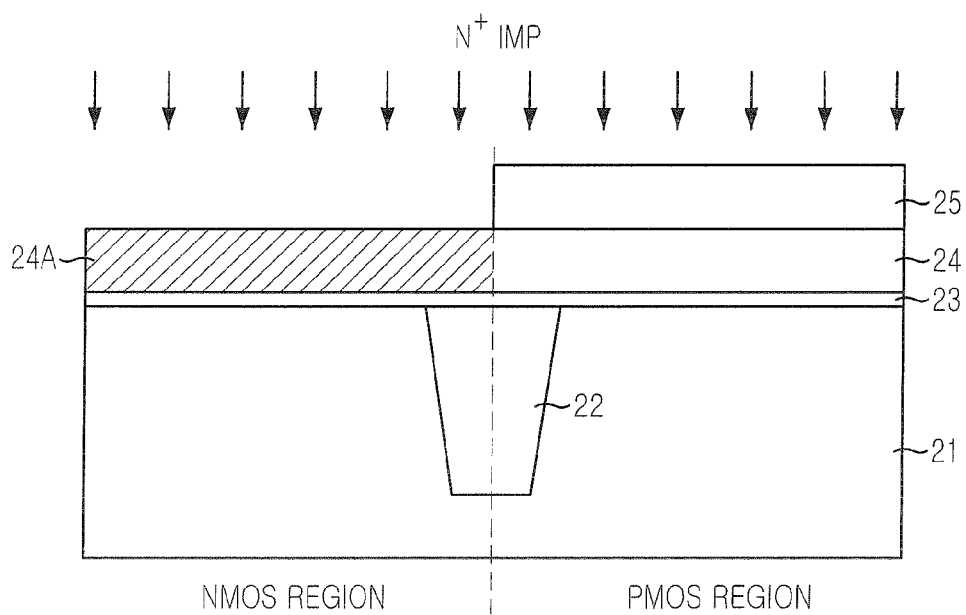
FIGS. 2A to 2D are cross-sectional views showing a method for removing a photoresist layer in accordance with a first embodiment of the present invention.

Referring to FIG. 2A, a substrate 21 is defined into an N-channel metal-oxide semiconductor (NMOS) region and a P-channel metal-oxide semiconductor (PMOS) region. A device isolation structure 22 is formed in the substrate 21 to isolate the NMOS region and the PMOS region. A gate oxide layer 23 is formed over the substrate 21. A gate polysilicon layer 24 and an N-type doped polysilicon layer 24A are formed over the gate oxide layer 23.

In more detail, a gate polysilicon material layer is formed over the gate oxide layer 23. A photoresist layer is formed over the gate polysilicon material layer. The photoresist layer is patterned by performing photo-exposure and developing processes to form a first photoresist pattern 25. The first photoresist pattern 25 exposes the NMOS region and covers the PMOS region.

N-type impurities are implanted into a portion of the gate polysilicon material layer in the NMOS region by employing an ion implantation process $N^+$ IMP using the first photoresist pattern 25 to form the N-type doped polysilicon layer 24A. A remaining portion of the gate polysilicon material layer in the PMOS region is referred to as the gate polysilicon layer 24. The N-type impurities include phosphorus (P) or arsenic (As). A very high ion implantation dose of approximately $1 \times 10^{16}$ cm$^{-2}$ and a low ion implantation energy are used. Thus, the N-type doped polysilicon layer 24A is formed in the NMOS region and the gate polysilicon layer 24 remains in the PMOS region after the ion implantation process $N^+$ IMP of N-type impurities is performed. Hereinafter, the N-type doped polysilicon layer 24A is referred to as an $N^+$ polysilicon layer 24A.

Figure 2B:
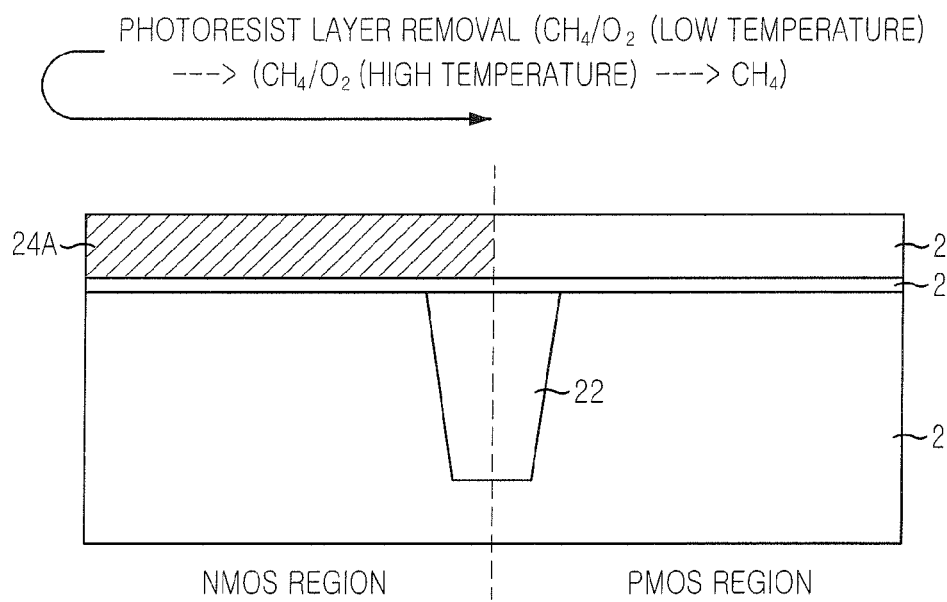

Referring to FIG. 2B, the first photoresist pattern 25 is removed. In more detail, a hydrocarbon-based gas, i.e., tetrafluoromethane ($CH_4$) or ethylene ($C_2H_4$), is added to a gas including oxygen ($O_2$) and nitrogen ($N_2$) to remove the first photoresist pattern 25. That is, a mixed gas of $O_2/N_2/CH_4$ or $O_2/N_2/C_2H_4$ is used to remove the first photoresist pattern 25. The hydrocarbon-based gas such as $CH_4$ or $C_2H_4$ removes the dopant inside the first photoresist pattern 25. $CH_4$ gas has a boiling point of approximately $-163°$ C. and $C_2H_4$ gas has a boiling point of approximately $-103°$ C. Thus, the dopant may be easily removed at a low temperature as a hydride form.

Microwave and radio frequency (RF) bias are simultaneously used as a power supply for generating a plasma during the removal of the first photoresist pattern 25. At this time, a gas including a hydrocarbon-based gas is used. For instance, $CH_4$ or $C_2H_4$ may be independently (solely) used or $O_2$ may be added to $CH_4$ or $C_2H_4$. Accordingly, a gas selected from a group consisting of $CH_4$, $C_2H_4$, $CH_4/O_2$, and $C_2H_4/O_2$ may be used. When $O_2$ is added to the hydrocarbon-based gas, a ratio of $CH_4$ to $O_2$ or $C_2H_4$ to $O_2$ ranges approximately 4-10:1, the hydrocarbon-based gas having a larger flow rate than oxygen.

One round of the removal of the first photoresist pattern 25 performed under the above-described conditions includes performing a first, a second, and a third step. Hereinafter, a mixed gas including $CH_4$ and $O_2$ is used. The first step includes using a plasma including $CH_4$ gas and $O_2$ gas at a low temperature ranging from approximately 100° C. to approximately 160° C. The second step includes using a plasma including $CH_4$ gas and $O_2$ gas at a temperature higher than that of the first step, that is, a temperature ranging from approximately 200° C. to approximately 250° C. The third step includes using a plasma of $CH_4$ gas alone.

The first step is performed at a low temperature ranging from approximately 100° C. to approximately 160° C., using the mixed plasma of $CH_4$ gas and $O_2$ gas. The $CH_4$ plasma functions as a forming gas that secedes impurities, i.e., As. The $CH_4$ plasma secedes As, that is implanted in the first photoresist pattern 25 during the ion implantation, from the inside to the outside of the first photoresist pattern 25. The $O_2$ plasma functions to remove the first photoresist layer 25.

The first step is performed at a low temperature because the first step is primarily focused on generating secession of As using the $CH_4$ plasma rather than reacting the $O_2$ plasma with As to generate diarsenic oxide ($As_2O_3$). That is, at the low temperature ranging from approximately 100° C. to approximately 160° C., the secession of As by the $CH_4$ plasma occurs before the generation of $As_2O_3$ by the $O_2$ plasma. Then, the first photoresist pattern 25 is removed by the $O_2$ plasma.

When a mixed gas of $CH_4$ gas and $O_2$ gas is implanted and electrical energy, i.e., microwave and RF bias, is simultaneously supplied, the implanted gas activates into a plasma state, i.e., positive ions, negative ions, electrons, and radicals, because of the accelerated collisions of electrons. Ions and radicals of $CH_4/O_2$ gas generated in the plasma state participate in the removal of the photoresist and the secession of impurities. The first to the third step include simultaneously using microwave MW and RF bias for generating plasmas. Thus, the $CH_4$ gas is transformed as $CH_4$ MW plasma and $CH_4$ RF biased plasma and functions as the same, and the $O_2$ gas is transformed as $O_2$ MW plasma and $O_2$ RF biased plasma and functions as the same, during the first to the third step.

The secession process of As remaining in the first photoresist pattern 25 may be expressed in Chemical Formulae 1 described below.

$$2As + 6H^* \rightarrow As_2H_6 (gas)$$

$$As + O^*/O_3 \rightarrow As_2O_3 (solid)$$

$$As_2O_3 + 12H^* \rightarrow As_2H_6(gas) + 3H_2O(gas) \quad \text{[Chemical Formulae 1]}$$

Referring to Chemical Formulae 1, As represents arsenic remaining within the first photoresist pattern 25. H* represents a hydrogen radical included in the CH$_4$ plasma, and O*/O$_3$ is included in the O$_2$ plasma. As remaining in the first photoresist pattern 25 reacts with H* to generate As$_2$H$_6$ (gas) and is volatilized. Even if As remaining in the first photoresist pattern 25 reacts with O* or O$_3$ included in the O$_2$ plasma to generate solid As$_2$O$_3$, As$_2$O$_3$ reacts with H* to generate As$_2$H$_6$ (gas) and is volatilized. 3H$_2$O (gas) is a by-product generated by the reaction between As$_2$O$_3$ and H*, and is volatilized as gas.

It should be noted that, when removing a photoresist layer using only O$_2$ plasma, the O$_2$ may primarily react with the As implanted in the photoresist layer rather than remove the photoresist layer. Thus, an impurity oxide layer including solid As$_2$O$_3$ may be generated before the removal of the photoresist layer. Consequently, the removal of the photoresist layer is interrupted by the generation of the solid As$_2$O$_3$. Thus, using the mixed plasma of CH$_4$ gas and O$_2$ gas prevents the formation of solid As$_2$O$_3$ on a surface of the first photoresist pattern 25 by seceding As remaining in the first photoresist pattern 25.

Subsequently, the second step is performed after the first step is performed. The second step includes performing the second step at a higher temperature than that of the first step, using substantially the same plasmas, i.e., a mixed gas of CH$_4$ and O$_2$. The higher temperature, i.e., a temperature ranging from approximately 200° C. to approximately 250° C., is applied to remove the first photoresist pattern 25 at a faster rate.

Therefore, the secession of As, which is an impurity, is primarily achieved before the removal of the first photoresist pattern 25 during the first step, and the removal of the first photoresist pattern 25 is primarily achieved during the second step because the secession of As occurs during the first step. Meanwhile, if the removal of photoresist is directly performed at a high temperature, drawbacks such as popping may occur, and thus, a removal rate may decrease. Therefore, performing the first step at a low temperature and then performing the second step at a high temperature generally improves the removal rate.

The third step is performed after the second step. The third step includes removing As remaining in by-products generated after the removal of the first photoresist pattern 25, using the CH$_4$ plasma alone. Thus, the third step removes residual impurities in the by-products after removing the first photoresist pattern 25. Consequently, the first photoresist pattern 25 is substantially removed without residue by performing a series of the first step to the third step.

Meanwhile, when phosphorus (P) is implanted in the N$^+$ polysilicon layer 24A, the P is seceded by Chemical Formulae 2 described below.

$$P + 3H^* \rightarrow PH_3 (gas)$$

$$P + O^*/O_3 \rightarrow P_4O_6 (solid) \text{ or } P_4O_{10}(gas)$$

$$P_4O_6 + 24H^* \rightarrow 4PH_3(gas) + 6H_2O(gas)$$

$$P_4O_{10} + 32H^* \rightarrow 4PH_3(gas) + 10H_2O(gas) \quad \text{[Chemical Formulae 2]}$$

Figure 2C:
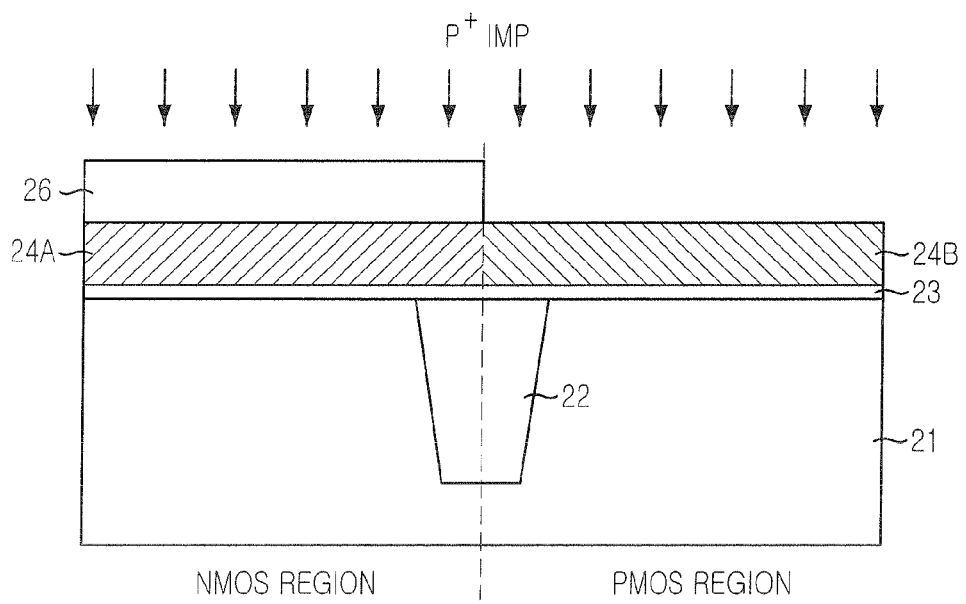

Referring to FIG. 2C, another photoresist layer is formed over the substrate structure after the first photoresist pattern 25 is removed. Photo-exposure and developing processes are performed to form a second photoresist pattern 26 using the aforementioned series of methods. In more detail, the other photoresist layer is formed and the photo-exposure and developing processes are performed while the N$^+$ polysilicon layer 24A and the gate polysilicon layer 24 coexist. Thus, the second photoresist pattern 26 exposing the PMOS region and covering the NMOS region is formed.

P-type impurities are implanted into the gate polysilicon layer 24 in the PMOS region by employing an ion implantation process P$^+$ IMP using the second photoresist pattern 26 to form a P-type doped polysilicon layer 24B. Hereinafter, the P-type doped polysilicon layer 24B is referred to as the P$^+$ polysilicon layer 24B. The P-type impurities include boron (B). A very high ion implantation dose of approximately 1×10$^{16}$ cm$^{-2}$ and a low ion implantation energy are used.

Figure 2D:
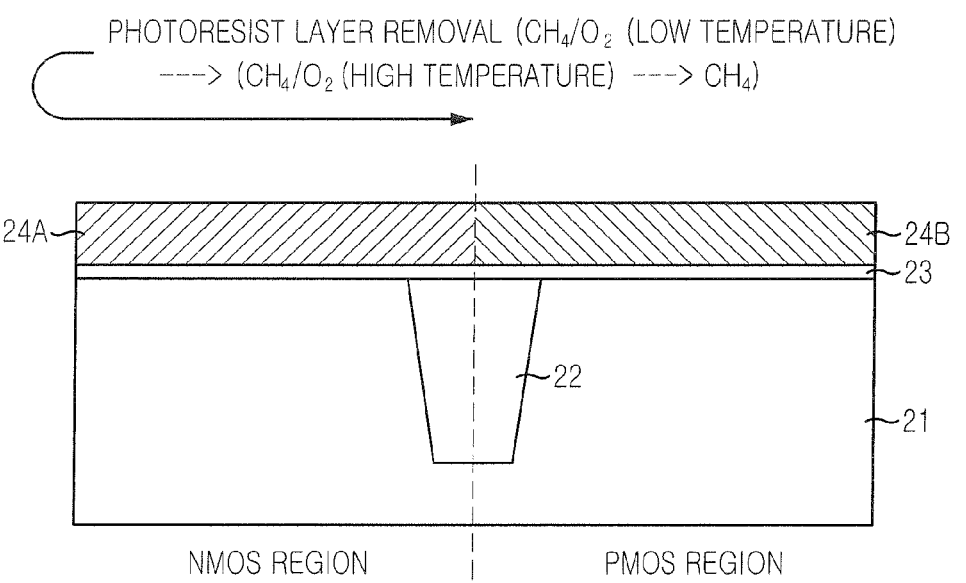

Referring to FIG. 2D, the second photoresist pattern 26 is removed. In more detail, a hydrocarbon-based gas, i.e., CH$_4$ or C$_2$H$_4$, is added to a gas including O$_2$ and N$_2$ to remove the second photoresist pattern 26. That is, a mixed gas of O$_2$/N$_2$/CH$_4$ or O$_2$/N$_2$/C$_2$H$_4$ is used to remove the second photoresist pattern 26. The hydrocarbon-based gas such as CH$_4$ or C$_2$H$_4$ removes a dopant inside the second photoresist pattern 26. CH$_4$ gas has a boiling point of approximately −163° C. and C$_2$H$_4$ gas has a boiling point of approximately −103° C. Thus, the dopant may be easily removed at a low temperature in a hydride form.

Microwave and radio frequency (RF) bias are simultaneously used as a power supply for generating plasmas during the removal of the second photoresist pattern 26. At this time, a gas including a hydrocarbon-based gas is used. For instance, CH$_4$ or C$_2$H$_4$ may be used alone or O$_2$ may be added to CH$_4$ or C$_2$H$_4$. Accordingly, a gas selected from a group consisting of CH$_4$, C$_2$H$_4$, CH$_4$/O$_2$, and C$_2$H$_4$/O$_2$ may be used. When O$_2$ is added to the hydrocarbon-based gas, a ratio of CH$_4$ to O$_2$ or C$_2$H$_4$ to O$_2$ ranges approximately 4-10:1, the hydrocarbon-based gas having a larger flow rate than oxygen.

One round of the removal of the second photoresist pattern 26 performed under the above-described conditions includes performing a first, a second, and a third step. A mixed gas including CH$_4$ and O$_2$ is used. The first step includes using plasma including CH$_4$ gas and O$_2$ gas at a low temperature ranging from approximately 100° C. to approximately 160° C. The second step includes using a plasma including CH$_4$ gas and O$_2$ gas at a temperature higher than that of the first step, that is, a temperature ranging from approximately 200° C. to approximately 250° C. The third step includes using a plasma of CH$_4$ gas alone.

The first step is performed at a low temperature ranging from approximately 100° C. to approximately 160° C., using the mixed plasma of CH$_4$ gas and O$_2$ gas. The CH$_4$ plasma functions as a forming gas that secedes impurities, i.e., boron (B). The CH$_4$ plasma secedes B, that is implanted in the second photoresist pattern 26 during the ion implantation, from the inside to the outside of the second photoresist pattern 26. The O$_2$ plasma functions to remove the second photoresist layer 26.

The first step is performed at a low temperature because the first step is primarily focused on generating secession of B using the CH$_4$ plasma rather than reacting the O$_2$ plasma with B to generate diboron trioxide (B$_2$O$_3$). That is, at the low temperature ranging from approximately 100° C. to approximately 160° C., the secession of B by the $CH_4$ plasma occurs before the generation of $B_2O_3$ by the $O_2$ plasma. Then, the second photoresist pattern 26 is removed by the $O_2$ plasma.

When a mixed gas of $CH_4$ gas and $O_2$ gas is implanted and electrical energy, i.e., microwave and RF bias, is simultaneously supplied, the implanted gas activates into a plasma state, i.e., positive ions, negative ions, electrons, and radicals, because of the accelerated collisions of electrons. Ions and radicals of $CH_4/O_2$ gas generated in the plasma state participate in the removal of the photoresist and the secession of impurities. The first to the third step include simultaneously using microwave MW and RF bias to generate plasmas. Thus, the $CH_4$ gas is transformed as $CH_4$ MW plasma and $CH_4$ RF biased plasma and functions as the same, and the $O_2$ gas is transformed as $O_2$ MW plasma and $O_2$ RF biased plasma and functions as the same, during the first to the third step.

The secession process of B remaining in the second photoresist pattern 26 may be expressed in Chemical Formulae 3 described below.

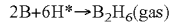

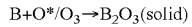

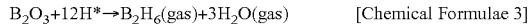 [Chemical Formulae 3]

Referring to Chemical Formulae 3, B represents boron remaining inside the second photoresist pattern 26. H* represents a hydrogen radical included in the $CH_4$ plasma, and $O^*/O_3$ is included in the $O_2$ plasma. B remaining in the second photoresist pattern 26 reacts with H* to generate $B_2H_6$ (gas) and is volatilized. Even if B remaining in the second photoresist pattern 26 reacts with O* or $O_3$ included in the $O_2$ plasma to generate solid $B_2O_3$, $B_2O_3$ reacts with H* to generate $B_2H_6$ (gas) and is volatilized. $3H_2O$ is a by-product generated by the reaction between $B_2O_3$ and H*, and is volatilized as gas.

Note should be had to the fact that, when removing a photoresist layer using only $O_2$ plasma, $O_2$ may primarily react with B implanted in the photoresist layer rather than remove the photoresist layer. Thus, an impurity oxide layer including solid $B_2O_3$ may be generated before the removal of the photoresist layer. Consequently, the removal of the photoresist layer is interrupted by the generation of the solid $B_2O_3$. Thus, using the mixed plasma of $CH_4$ gas and $O_2$ gas prevents solid $B_2O_3$ from forming on a surface of the second photoresist pattern 26 by seceding B remaining in the second photoresist pattern 26.

The second step is performed after the first step is performed. The second step includes performing the second step at a higher temperature than that of the first step, using substantially the same plasmas, i.e., a mixed gas of $CH_4$ and $O_2$. The higher temperature, i.e., a temperature ranging from approximately 200° C. to approximately 250° C., is applied to remove the second photoresist pattern 26 at a faster rate.

Therefore, the secession of B primarily occurs before the removal of the second photoresist pattern 26 during the first step, and the removal of the second photoresist pattern 26 is substantially achieved during the second step because the secession of B occurring during the first step. The third step is performed after the second step. The third step includes removing B remaining in by-products generated after the removal of the second photoresist pattern 26, using the $CH_4$ plasma independently (viz., alone). Thus, the third step removes residual impurities in the by-products after removing the second photoresist pattern 26. Consequently, the second photoresist pattern 26 is substantially removed without residues by performing a series of the first step to the third step.

Figure 3:
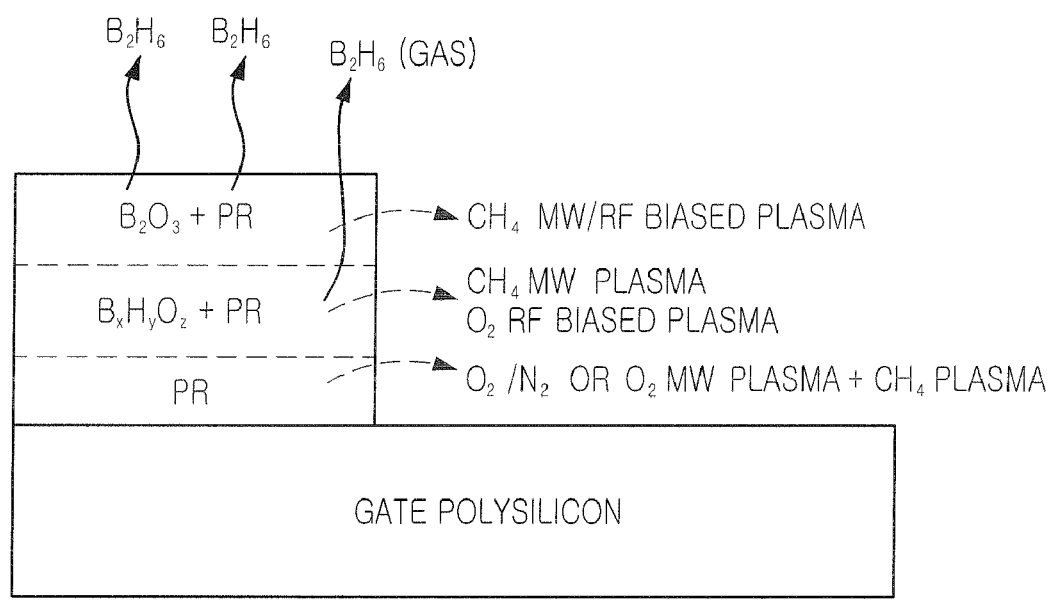
FIG. 3 is a cross-sectional view showing a removal process of a photoresist layer using a mixed plasma of $CH_4/O_2$ after implanting boron ions at high dose with a low ion implantation energy level.

FIG. 3 is a cross-sectional view showing a removal process of a photoresist layer using a mixed plasma of $CH_4/O_2$ after implanting a high dose of boron with a low ion implantation energy level. Simultaneous usage of microwave MW and RF bias to generate plasmas causes the $CH_4$ gas to transform as $CH_4$ MW plasma and $CH_4$ RF biased plasma and function as the same, and the $O_2$ gas to transform as $O_2$ MW plasma and $O_2$ RF biased plasma and function as the same.

The photoresist layer is divided into three portions, including a surface layer, a middle layer, and a bottom layer. Photoresist PR and $B_2O_3$ coexist in the surface layer of the photoresist layer during the removal process. Only photoresist PR exists in the bottom layer contacting a gate poly silicon layer. $B_xH_yO_z$ and photoresist PR coexist in the middle layer disposed between the surface layer and the bottom layer. $B_xH_yO_z$, which is a hydride, existing in the middle layer is formed by a reaction between a hydrogen radical from the plasma and $B_2O_3$. $B_xH_yO_z$ is decomposed into gas and is volatilized by H*, like $B_2O_3$.

Photoresist PR and $B_2O_3$ in the surface layer are removed by the $CH_4$ MW plasma and the $CH_4$ RF biased plasma. $B_xH_yO_z$ and photoresist PR in the middle layer are removed by the $CH_4$ MW plasma and the $O_2$ RF biased plasma. Photoresist PR in the bottom layer is removed by the $CH_4$ plasma and $O_2/N_2$ or the $O_2$ MW plasma. $B_2O_3$ and $B_xH_yO_z$ in each layer are volatilized as $B_2H_6$ according to the principle of Chemical Formulae 3 described above.

The bottom layer including only photoresist PR is removed by the $CH_4$ plasma, $O_2/N_2$, and the $O_2$ MW plasma. Typically, photoresist PR is a polymer of carbon (C) and hydrogen atom (H). Thus, photoresist PR reacts with $O_2$ to volatilize as $CO_2$ and $H_2O$ gases and be removed. Substantially the same mechanism as that shown in FIG. 3 occurs when $C_2H_4$ gas and $O_2$ gas are mixed to use in the removal process. In this embodiment, hydrocarbon gas, i.e., $C_2H_4$ and $CH_4$, is used such that the photoresist layer removal is easily performed through the generation of volatile hydrides.

Consistent with the first embodiment, dopants in the photoresist layer may be easily removed by employing hydrocarbon-based gas such as $C_2H_4$ and $CH_4$ during the removal process of the photoresist layer used as an ion implantation barrier. Thus, generation of an oxide layer by the dopants may be reduced, and the photoresist layer may be removed without generating residues.

Meanwhile, impurity oxide layers such as $As_2O_3$, $P_4O_6$, $P_4O_{10}$, and $B_2O_3$ are water-soluble. A pre-treatment for removing such impurity oxide layers is performed before performing the removal process of the photoresist layer, especially before the first step, using deionized water, i.e., $H_2O$, of an adequate temperature. The pre-treatment is referred to as a deionized water rinse treatment. The deionized water rinse treatment may include dipping the impurity oxide layers in a mixed solution of deionized water and ozone ($O_3$). The mixed solution has a temperature ranging from approximately 25° C. to approximately 80° C. A concentration level of $O_3$ ranges from approximately 0 ppm to approximately 1,000 ppm. For instance, the concentration level of $O_3$ may range from approximately 1 ppm to approximately 1,000 ppm. Also, deionized water may be denoted as $H_2O$.

The deionized water rinse treatment is performed to remove the impurity oxide layers such as $As_2O_3$, $P_4O_6$, $P_4O_{10}$, and $B_2O_3$ generated due to an exposure to the atmosphere, that is, a reaction between oxygen in the atmosphere and impurities, while moving to a photoresist removal apparatus after implanting the impurities. The deionized water rinse treatment removes the impurity oxide layers by softening a surface of the photoresist layer doped with impurities. A subsequent photoresist layer removal process becomes easier because the above-described pre-treatment using the deionized water is performed.

FIGS. 4A to 4E illustrate cross-sectional views showing a method for removing a photoresist layer consistent with a second embodiment of the invention.

Figure 4A:
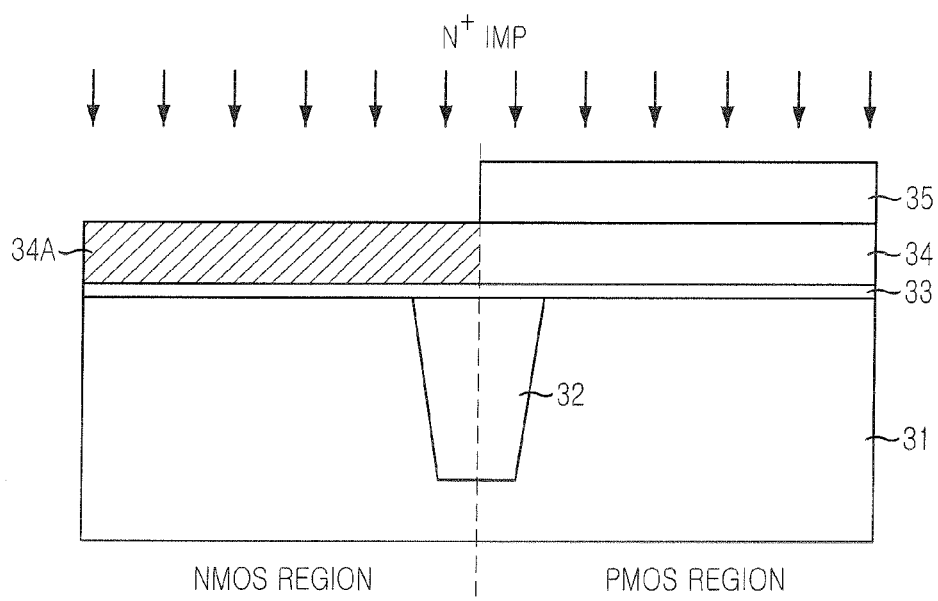
FIGS. 4A to 4E are cross-sectional views showing a method for removing a photoresist layer consistent with a second embodiment of the present invention.

Referring to FIG. 4A, a substrate 31 is defined into an N-channel metal-oxide semiconductor (NMOS) region and a P-channel metal-oxide semiconductor (PMOS) region. A device isolation structure 32 is formed in the substrate 31 to isolate the NMOS region and the PMOS region. A gate oxide layer 33 is formed over the substrate 31. A gate polysilicon layer 34 and an N-type doped polysilicon layer 34A are formed over the gate oxide layer 33.

In more detail, a gate polysilicon material layer is formed over the gate oxide layer 33. A photoresist layer is formed over the gate polysilicon material layer. The photoresist layer is patterned by performing photo-exposure and developing processes to form a first photoresist pattern 35. The first photoresist pattern 35 exposes the NMOS region and covers the PMOS region.

N-type impurities are implanted into a portion of the gate polysilicon material layer in the NMOS region by employing an ion implantation process $N^+$ IMP using the first photoresist pattern 35 to form the N-type doped polysilicon layer 34A. A remaining portion of the gate polysilicon material layer in the PMOS region is referred to as the gate polysilicon layer 34. The N-type impurities include phosphorus (P) or arsenic (As). A very high ion implantation dose of approximately $1 \times 10^{16}$ cm$^{-2}$ and a low ion implantation energy are used.

Thus, the N-type doped polysilicon layer 34A is formed in the NMOS region and the gate polysilicon layer 34 remains in the PMOS region after the ion implantation process $N^+$ IMP of N-type impurities is performed. Hereinafter, the N-type doped polysilicon layer 34A is referred to as an $N^+$ polysilicon layer 34A.

Figure 4B:
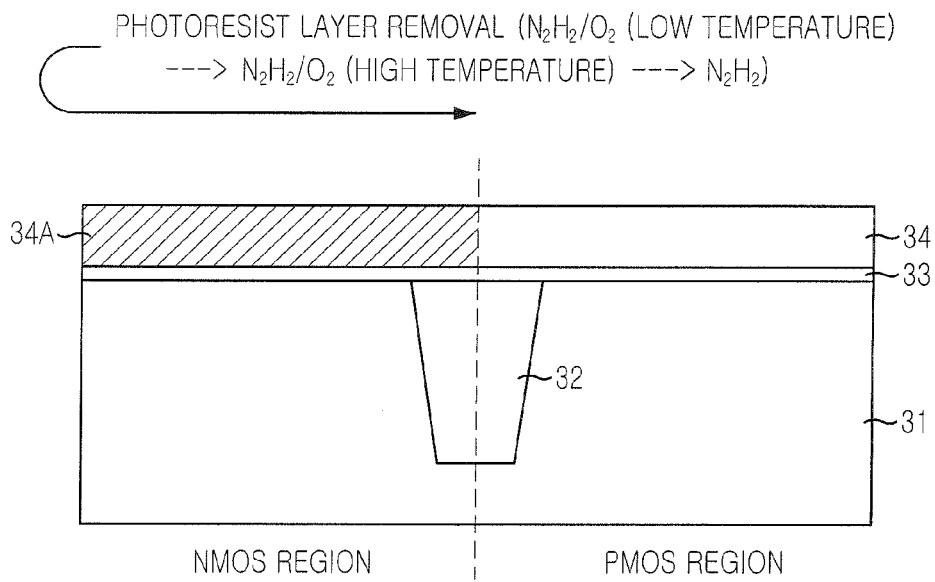

Referring to FIG. 4B, the first photoresist pattern 35 is removed. Instead of removing the first photoresist pattern 35 using the typically used oxygen plasma or plasma of a mixed gas including nitrogen and oxygen ($N_2/O_2$ plasma), the first photoresist pattern 35 is removed by performing one round of a removal process including a first, a second, and a third step.

The first step includes using plasma including diimide ($N_2H_2$) gas and $O_2$ gas at a low temperature ranging from approximately 100° C. to approximately 160° C. The $N_2H_2$ gas includes approximately 4% of $H_2$ and approximately 96% of $N_2$. A ratio of $N_2H_2$ to $O_2$ ranges approximately 4-6:1. The second step includes using plasma including $N_2H_2$ gas and $O_2$ gas at a temperature higher than that of the first step, that is, a temperature ranging from approximately 200° C. to approximately 250° C. The $N_2H_2$ gas includes approximately 4% of $H_2$ and approximately 96% of $N_2$. A ratio of $N_2H_2$ to $O_2$ ranges approximately 4-6:1. The third step includes using a plasma of $N_2H_2$ gas alone.

The first step is performed at a low temperature ranging from approximately 100° C. to approximately 160° C., using the mixed plasma of $N_2H_2$ gas and $O_2$ gas, that is, $N_2H_2$ plasma and $O_2$ plasma. The $N_2H_2$ plasma functions as a forming gas that secedes impurities, i.e., arsenic (As). The $N_2H_2$ plasma secedes As implanted in the first photoresist pattern 35 from the inside to the outside of the first photoresist pattern 35. The $O_2$ plasma functions to substantially remove the first photoresist layer 35.

The first step is performed at a low temperature because the first step is primarily focused on generating secession of As using the $N_2H_2$ plasma rather than reacting the $O_2$ plasma with As to generate diarsenic oxide ($As_2O_3$). That is, at the low temperature ranging from approximately 100° C. to approximately 160° C., the secession of As by the $N_2H_2$ plasma occurs before the generation of $As_2O_3$ by the $O_2$ plasma. Then, the first photoresist pattern 35 is removed by the $O_2$ plasma.

When a mixed gas of $N_2H_2$ gas and $O_2$ gas is introduced into a chamber and electrical energy, i.e., microwave and RF bias, is simultaneously supplied, the gas activates and assumes a plasma state, i.e., positive ions, negative ions, electrons, and radicals, because of the accelerated collisions of electrons. Ions and radicals of $N_2H_2/O_2$ gas generated in the plasma state participate in the removal of the photoresist and the secession of impurities. The first to the third step include simultaneously using microwave MW and RF bias for generating plasmas. Thus, the $N_2H_2$ gas is transformed as $N_2H_2$ MW plasma and $N_2H_2$ RF biased plasma and functions as the same, and the $O_2$ gas is transformed as $O_2$ MW plasma and $O_2$ RF biased plasma and functions as the same, during the first to the third step.

The secession process of As is described in detail.

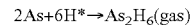

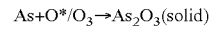

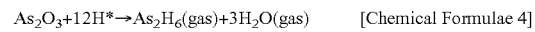     [Chemical Formulae 4]

Referring to Chemical Formulae 4, As represents arsenic remaining inside the first photoresist pattern 35. H* represents a hydrogen radical included in the $N_2H_2$ plasma, and $O^*/O_3$ is included in the $O_2$ plasma.

As remaining in the first photoresist pattern 35 reacts with H* to generate $As_2H_6$ (gas) and is volatilized. Even if As remaining in the first photoresist pattern 35 reacts with O* or $O_3$ included in the $O_2$ plasma to generate solid $As_2O_3$, $As_2O_3$ reacts with H* to generate $As_2H_6$ (gas) and is volatilized. $3H_2O$ (gas) is a by-product generated by the reaction between $As_2O_3$ and H*, and is volatilized as gas.

For reference, when removing a photoresist layer according to a typical method using only $O_2$ plasma, $O_2$ may primarily react with As implanted in the photoresist layer rather than remove the photoresist layer. Thus, an impurity oxide layer including solid $As_2O_3$ may be generated before the removal of the photoresist layer. Consequently, the removal of the photoresist layer is interrupted by the generation of solid $As_2O_3$.

Thus, using the mixed plasma of $N_2H_2$ gas and $O_2$ gas prevents solid $As_2O_3$ of from forming on a surface of the first photoresist pattern 35 by seceding As remaining in the first photoresist pattern 35.

Subsequently, the second step is performed after the first step is performed. The second step is performed at a higher temperature than that of the first step, while using substantially the same plasmas, i.e., a mixed gas of $N_2H_2$ and $O_2$. The higher temperature, i.e., a temperature ranging from approximately 200° C. to approximately 250° C., is applied to remove the first photoresist pattern 35 at a faster rate. Therefore, the secession of As, which is an impurity, is primarily achieved before the removal of the first photoresist pattern 35 during the first step, and the removal of the first photoresist pattern 35 is substantially achieved during the second step because of the secession of As during the first step.

The third step is performed after the second step. The third step includes removing As remaining in by-products generated after the removal of the first photoresist pattern 35, using the $N_2H_2$ plasma alone. Thus, the third step removes residual impurities in the by-products after removing the first photoresist pattern 35. Consequently, the first photoresist pattern 35 is substantially removed without residues by performing a series of the first step to the third step.

Meanwhile, when phosphorus (P) is implanted in the N+ polysilicon layer 34A, the P is seceded by Chemical Formulae 5 described below.

$$P + 3H^* \rightarrow PH_3(\text{gas})$$

$$P + O^*/O_3 \rightarrow P_4O_6(\text{solid}) \text{ or } P_4O_{10}(\text{gas})$$

$$P_4O_6 + 24H^* \rightarrow 4PH_3(\text{gas}) + 6H_2O(\text{gas})$$

$$P_4O_{10} + 32H^* \rightarrow 4PH_3(\text{gas}) + 10H_2O(\text{gas}) \quad \text{[Chemical Formulae 5]}$$

Figure 4C:
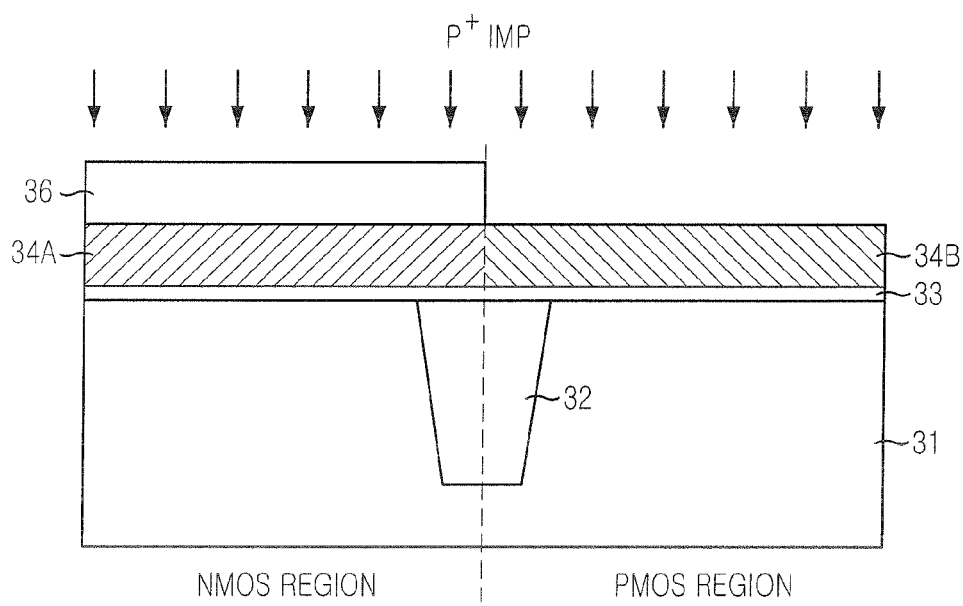

Referring to FIG. 4C, another photoresist layer is formed over the substrate structure after the first photoresist pattern 35 is removed. Photo-exposure and developing processes are performed to form a second photoresist pattern 36 using the aforementioned series of methods. In more detail, the other photoresist layer is formed and the photo-exposure and developing processes are performed while the N+ polysilicon layer 34A and the gate polysilicon layer 34 coexist. Thus, the second photoresist pattern 36 exposing the PMOS region and covering the NMOS region is formed.

P-type impurities are implanted into the gate polysilicon layer 34 in the PMOS region by employing an ion implantation process P+ IMP using the second photoresist pattern 36 to form a P-type doped polysilicon layer 34B. Hereinafter, the P-type doped polysilicon layer 34B is referred to as the P+ polysilicon layer 34B. The P-type impurities include boron (B). A very high ion implantation dose of approximately $1 \times 10^{16}$ cm$^{-2}$ and a low ion implantation energy are used.

Figure 4D:
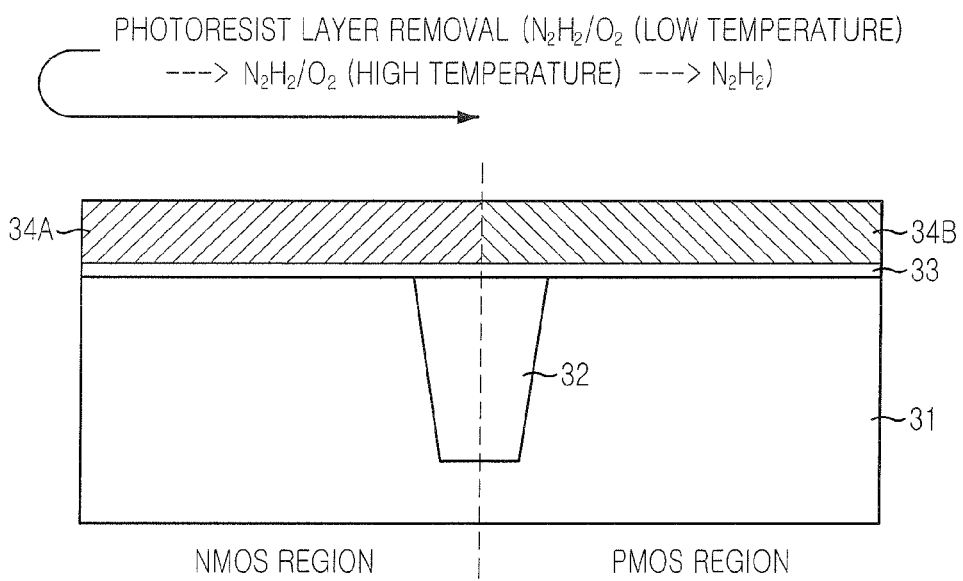

Referring to FIG. 4D, the second photoresist pattern 36 is removed. Like the removal of the first photoresist pattern 35, the second photoresist pattern 36 is removed by performing a first, a second, and a third step. The steps are described in detail. The first step includes using plasma including N$_2$H$_2$ gas and O$_2$ gas at a low temperature ranging from approximately 100° C. to approximately 160° C. The N$_2$H$_2$ gas includes approximately 4% of H$_2$ and approximately 96% of N$_2$. A ratio of N$_2$H$_2$ to O$_2$ ranges approximately 4-6:1. The second step includes using plasma including N$_2$H$_2$ gas and O$_2$ gas at a temperature higher than that of the first step, that is, a temperature ranging from approximately 200° C. to approximately 250° C. The N$_2$H$_2$ gas includes approximately 4% of H$_2$ and approximately 96% of N$_2$. A ratio of N$_2$H$_2$ to O$_2$ ranges approximately 4-6:1. The third step includes using plasma of N$_2$H$_2$ gas alone.

The first step is performed at a low temperature ranging from approximately 100° C. to approximately 160° C., using a mixed plasma of N$_2$H$_2$ gas and O$_2$ gas, that is, N$_2$H$_2$ plasma and O$_2$ plasma. The N$_2$H$_2$ plasma functions as a forming gas that secedes impurities. In this instance, the N$_2$H$_2$ plasma secedes impurities, i.e., boron (B), that are implanted in the second photoresist pattern 36 during the ion implantation, from the inside to the outside of the second photoresist pattern 36. The O$_2$ plasma functions to substantially remove the second photoresist layer 36.

The first step is performed at a low temperature because the first step is primarily focused on generating secession of B using the N$_2$H$_2$ plasma rather than reacting the O$_2$ plasma with B to generate diboron trioxide (B$_2$O$_3$). That is, at the low temperature ranging from approximately 100° C. to approximately 160° C., the secession of B by the N$_2$H$_2$ plasma occurs before the generation of B$_2$O$_3$ by the O$_2$ plasma. Then, the second photoresist pattern 36 is removed by the O$_2$ plasma.

When a mixed gas of N$_2$H$_2$ gas and O$_2$ gas is implanted into a chamber and electrical energy, i.e., microwave and RF bias, is simultaneously supplied, the implanted gas activates into a plasma state, i.e., positive ions, negative ions, electrons, and radicals, because of the accelerated collisions of electrons. Ions and radicals of N$_2$H$_2$/O$_2$ gas generated in the plasma state participate in the removal of the photoresist and the secession of impurities. The first to the third step include simultaneously using microwave MW and RF bias for generating plasmas. Thus, the N$_2$H$_2$ gas is transformed as N$_2$H$_2$ MW plasma and N$_2$H$_2$ RF biased plasma and functions as the same, and the O$_2$ gas is transformed as O$_2$ MW plasma and O$_2$ RF biased plasma and functions as the same, during the first to the third step.

The secession process of B is described in detail.

$$2B + 6H^* \rightarrow B_2H_6(\text{gas})$$

$$B + O^*/O_3 \rightarrow B_2O_3(\text{solid})$$

$$B_2O_3 + 12H^* \rightarrow B_2H_6(\text{gas}) + 3H_2O(\text{gas}) \quad \text{[Chemical Formulae 6]}$$

Referring to Chemical Formulae 6, B represents boron remaining inside the second photoresist pattern 36. H* represents a hydrogen radical included in the N$_2$H$_2$ plasma, and O*/O$_3$ is included in the O$_2$ plasma. B remaining in the second photoresist pattern 36 reacts with H* to generate B$_2$H$_6$ (gas) and is volatilized. Even if B remaining in the second photoresist pattern 36 reacts with O* or O$_3$ included in the O$_2$ plasma to generate solid B$_2$O$_3$. B$_2$O$_3$ reacts with H* to generate B$_2$H$_6$ (gas) and is volatilized. 3H$_2$O is a by-product generated by the reaction between B$_2$O$_3$ and H*, and is volatilized as gas.

When removing a photoresist layer according to the typical method using only O$_2$ plasma, O$_2$ may primarily react with B implanted in the photoresist layer rather than remove the photoresist layer. Thus, an impurity oxide layer including solid B$_2$O$_3$ may be generated before the removal of the photoresist layer. Consequently, the removal of the photoresist layer is interrupted by the generation of solid B$_2$O$_3$. Thus, using the mixed plasma of N$_2$H$_2$ gas and O$_2$ gas prevents solid B$_2$O$_3$ from forming on a surface of the second photoresist pattern 36 by seceding B remaining in the second photoresist pattern 36.

Subsequently, the second step is performed after the first step is performed. The second step includes performing the second step at a higher temperature than that of the first step, using substantially the same plasmas, i.e., a mixed gas of N$_2$H$_2$ and O$_2$. The higher temperature, i.e., a temperature ranging from approximately 200° C. to approximately 250° C., is applied to remove the second photoresist pattern 36 at a faster rate. Therefore, the secession of B is primarily carried out before the removal of the second photoresist pattern 36 during the first step, and the removal of the second photoresist pattern 36 is substantially carried out during the second step because the secession of B occurred during the first step. The third step is performed after the second step. The third step includes removing B remaining in by-products generated after the removal of the second photoresist pattern 36, using the N$_2$H$_2$ plasma alone. Thus, the third step removes residual B in the by-products after removing the second photoresist pattern 36. Consequently, the second photoresist pattern 36 is substantially removed without residues by performing a series of the first step to the third step.

Figure 4E:
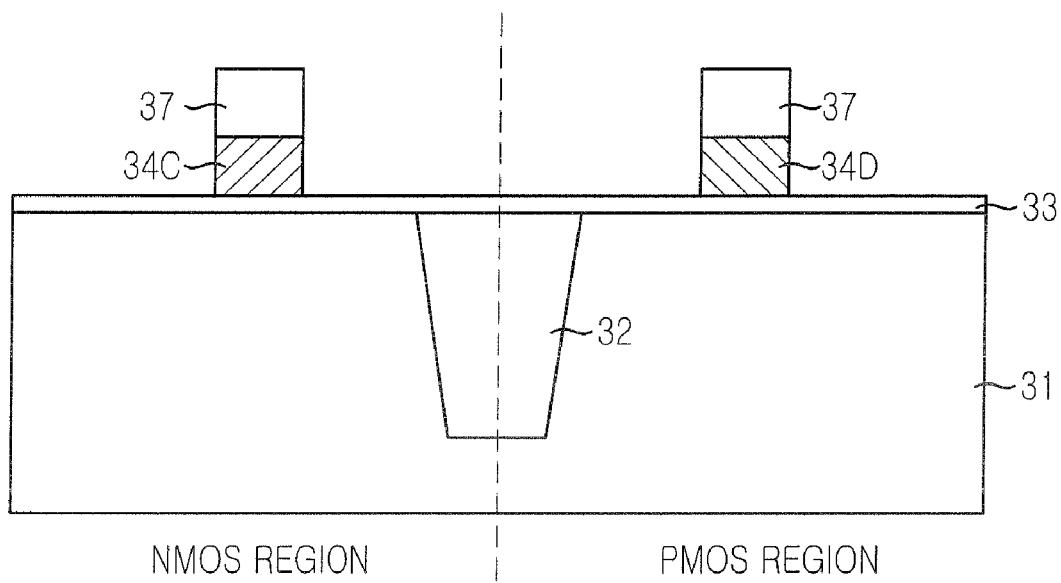

Referring to FIG. 4E, after removing the second photoresist pattern 36 using the above-described series of methods, tungsten silicide layers 37 are formed over the resultant substrate structure. A gate patterning process is performed onto the substrate structure to form an N+ poly gate 34C in the NMOS region and a P+ poly gate 34D in the PMOS region.

The N+ poly gate 34C includes N-type doped polysilicon and the P+ poly gate 34D includes P-type doped polysilicon.

Figure 5:
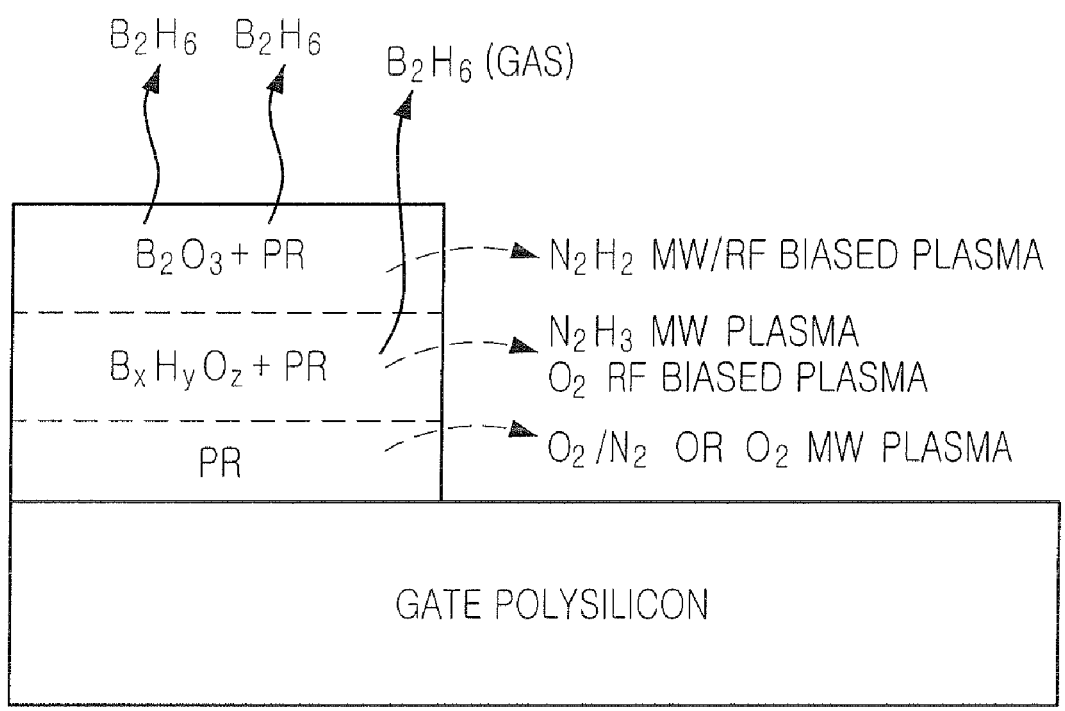
FIG. 5 is a cross-sectional view showing a removal process of a photoresist layer using a mixed plasma of $N_2H_2/O_2$ after implanting boron at high dose with a low ion implantation energy level.

FIG. 5 is a cross-sectional view showing a removal process of a photoresist layer using a mixed plasma of $N_2H_2/O_2$ after implanting boron at high dose with a low ion implantation energy level. Simultaneous usage of microwave MW and RF bias to generate plasmas causes the $N_2H_2$ gas to transform as $N_2H_2$ MW plasma and $N_2H_2$ RF biased plasma and function as the same, and the $O_2$ gas to transform as $O_2$ MW plasma and $O_2$ RF biased plasma and function as the same.

The photoresist layer is divided into three portions, including a surface layer, a middle layer, and a bottom layer. Photoresist PR and $B_2O_3$ coexist in the surface layer of the photoresist layer during the removal process. Only photoresist PR exists in the bottom layer contacting a gate poly silicon layer. $B_xH_yO_z$ and photoresist PR coexist in the middle layer disposed between the surface layer and the bottom layer. $B_xH_yO_z$ existing in the middle layer is formed by a reaction between a hydrogen radical from the plasma and $B_2O_3$. $B_xH_yO_z$ is decomposed into gas and is volatilized by H*, like $B_2O_3$.

Photoresist PR and $B_2O_3$ in the surface layer are removed by the $N_2H_2$ MW plasma and the $N_2H_2$ RF biased plasma. $B_xH_yO_z$ and photoresist PR in the middle layer are removed by the $N_2H_2$ MW plasma and the $O_2$ RF biased plasma. Photoresist PR in the bottom layer is removed by $O_2/N_2$ or the $O_2$ MW plasma. $B_2O_3$ and $B_xH_yO_z$ in each layer are volatilized as $B_2H_6$ according to the principle of Chemical Formulae 6 described above. The bottom layer including only photoresist PR is removed by $O_2/N_2$ or the $O_2$ MW plasma. Typically, photoresist PR is a polymer of carbon (C) and hydrogen (H). Thus, photoresist PR reacts with $O_2$ to volatilize as $CO_2$ and $H_2O$ gases and to be removed.

Figure 6:
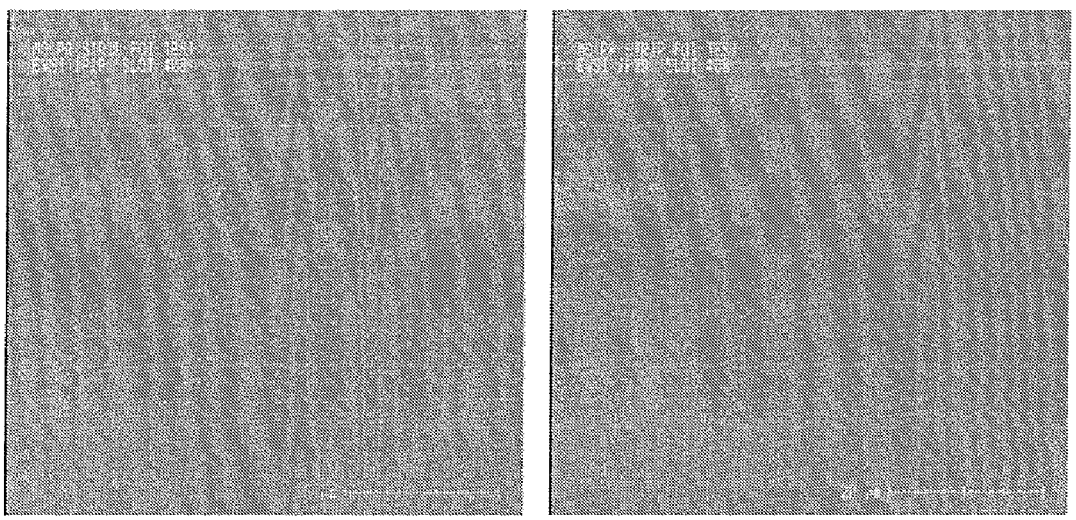
FIG. 6 are micrographic views showing residue free states in accordance with the second embodiment of the present invention.

FIG. 6 are micrographic views showing residue free states consistent with the second embodiment of the invention. Results shown in FIG. 6 are obtained by performing a removal process of a first photoresist pattern and a second photoresist pattern using the aforementioned first to third steps in sequential order under a certain condition. The certain condition includes using a pressure of approximately 1,700 mTorr in a plasma processing chamber and using a microwave MW power and a RF bias power of approximately 2,000 W each. These conditions also includes flowing $O_2$ at a rate of approximately 4,000 sccm and flowing $N_2H_2$ at a rate of approximately 800 sccm. Unlike the typical method, photoresist residues are absent as shown in FIG. 6.

Specific conditions of the first to the third step are as follows:

The first step: 1,700 mT/2,000 W/4,000 sccm $O_2$/800 sccm $N_2H_2$/middle

The second step: 1,700 mT/2,000 W/4,000 sccm $O_2$/800 sccm $N_2H_2$/down

The third step: 1,700 mT/2,000 W/0 sccm $O_2$/800 sccm $N_2H_2$

The terms "middle" and "down" described in the above specific conditions represent the temperature of the utilized equipment. The term "middle" denotes a temperature of approximately 150° C., and the term "down" denotes a temperature ranging from approximately 200° C. to approximately 250° C. The third step is performed at substantially the same temperature as the second step.

Meanwhile, impurity oxide layers such as $As_2O_3$, $P_4O_6$, $P_4O_{10}$, and $B_2O_3$ are water-soluble. A pre-treatment for removing such impurity oxide layers is performed before performing the removal process of the photoresist layer, especially before the first step, using deionized water, i.e., $H_2O$, of an adequate temperature. The pre-treatment is referred to as a deionized water rinse treatment. The deionized water rinse treatment may include dipping the impurity oxide layers in a mixed solution of deionized water and ozone ($O_3$). The mixed solution has a temperature ranging from approximately 25° C. to approximately 80° C. A concentration level of $O_3$ ranges from approximately 0 ppm to approximately 500 ppm. For instance, the concentration level of $O_3$ may range from approximately 1 ppm to approximately 500 ppm. Also, deionized water may be denoted as $H_2O$.

The deionized water rinse treatment is performed to remove the impurity oxide layers such as $As_2O_3$, $P_4O_6$, $P_4O_{10}$, and $B_2O_3$ generated due to an exposure to the atmosphere, that is, a reaction between oxygen in the atmosphere and impurities, while moving to a photoresist removal apparatus after implanting the impurities. The deionized water rinse treatment removes the impurity oxide layers by softening a surface of the photoresist layer doped with impurities. A subsequent photoresist layer removal process becomes easier because the above-described pre-treatment using the deionized water is performed.

FIGS. 7A to 7D are micrographic views showing results of a photoresist layer removal process according to usage and non-usage of a deionized water ($DI/O_3$) rinse treatment. The $DI/O_3$ rinse treatment is performed separately at a room temperature of approximately 25° C. and at a high temperature of approximately 80° C. FIGS. 7A and 7B illustrate results of a photoresist layer removal process performed during a dual poly gate process using a beam line ion implantation process. FIGS. 7C and 7D illustrate results of a photoresist layer removal process performed during a dual poly gate process using a plasma doping. 'EPR7-[P01]' and 'EN13-[P02D]' represent conditions of a photoresist layer removal using a typical compound of $O_2/N_2$.

Referring to FIG. 7A, contents of the classification of pre-treatments show results after 3 times of implantation, after $DI/O_3$ treatment, after $1^{st}$ photoresist (PR) removal, and after $2^{nd}$ PR removal, respectively. The described results in FIG. 7A show that photoresist residues are not detected when the $DI/O_3$ treatment is performed at a high temperature of approximately 80° C. and also when the $DI/O_3$ treatment is performed at a room temperature of approximately 25° C., both denoted as "RESIDUE FREE."

In FIG. 7B, contents of the classification of pre-treatments show results after 3 times of implantation, after $DI/O_3$ treatment, after PR removal, and after cleaning (CLN), respectively. The implantation includes implanting boron (B) using an ion implantation energy of approximately $1.5 \times 10^{16}$ through a beam line ion implantation process. The described results in FIG. 7B show that photoresist residues are not detected when the $DI/O_3$ treatment is performed at a room temperature of 25° C. and also when the photoresist layer is removed through four steps (using FOI stripper and employing one time of PR strip), skipping the $DI/O_3$ treatment, both denoted as "RESIDUE FREE".

The four steps are described below:

STEP 1: 1,700 mT/4,000 sccm $O_2$/400 sccm $N_2H_2$/middle 5"

STEP 2: 1,700 mT/2,000 W/4,000 sccm $O_2$/400 sccm $N_2H_2$/middle 60"

STEP 3: 1,700 mT/2,000 W/4,000 sccm $O_2$/400 sccm $N_2H_2$/down 50"

STEP 4: 1,700 mT/2,000 W/0 sccm $O_2$/400 sccm $N_2H_2$/down 20"

As described above, the photoresist layer may be removed without residues regardless of the $DI/O_3$ treatment when boron is implanted using the beam line ion implantation process.

FIG. 7C illustrates results of a photoresist layer removal process including a plasma doping (PLAD) process. The PLAD process refers to an ion implantation process performed using a plasma doping method. Contents of the classification of pre-treatments show results after PLAD process, after DI/O$_3$ treatment, after 1$^{st}$ PR removal, and after 2$^{nd}$ PR removal, respectively. The PLAD process includes employing an ion implantation energy of approximately 2.6×10$^{16}$. The described results in FIG. 7C show that photoresist residues are not detected when the DI/O$_3$ treatment is performed at a high temperature of approximately 80° C., denoted as "RESIDUE FREE". However, photoresist residues may remain when the DI/O$_3$ treatment is performed at a room temperature of approximately 25° C. The remaining photoresist residues may be removed by applying this embodiment of the present invention.

FIG. 7D illustrates results of a photoresist layer removal process including a PLAD process. The PLAD process includes implanting boron (B) using an ion implantation energy of approximately 3.0×10$^{16}$. The PLAD process refers to an ion implantation process performed using a plasma doping method. Contents of the classification of pre-treatments show results after PLAD process, after DI/O$_3$ treatment, after PR removal, and after CLN, respectively. The described results in FIG. 7D show that photoresist residues are not detected when the DI/O$_3$ treatment is performed at a room temperature of approximately 25° C., denoted as "RESIDUE FREE." However, photoresist residues may be detected when the DI/O$_3$ treatment is skipped.

According to FIGS. 7A to 7D, performing the DI/O$_3$ treatment has an effect of removing photoresist residues. Thus, the PR removal process consistent with the embodiments of the present invention may improve benefits of removing a photoresist layer without generating PR residues.

Consistent with the embodiments of the present invention, performing the removal process using the hydrocarbon-based gas, i.e., CH$_4$ and C$_2$H$_4$, may remove the photoresist layer used as a barrier during an ion implantation process at high dose without generating residues. Consequently, pattern lifting may decrease during a subsequent process, and thus, yield may increase.

Furthermore, performing the removal process including various steps using plasmas of a mixed gas including N$_2$H$_2$ and O$_2$ may remove the photoresist layer used as a barrier during an ion implantation process at high dose without generating residues. Consequently, pattern lifting may decrease during a subsequent process, and thus, yield may increase.

As noted above, the present application contains subject matter related to the Korean patent application Nos. KR 2006-62656 and KR 2006-90811, filed in the Korean Patent Office on Jul. 4, 2006 and Sep. 19, 2006, respectively, the entire contents of which being incorporated herein by reference.

While the present invention has been described with respect to a limited number of embodiments, it will be apparent to those skilled in the art that various changes and modifications may be made without departing from the spirit and scope of the invention as defined in the following claims.

What is claimed is:

1. A method, comprising:
    forming a photoresist pattern over a certain portions of a material layer to expose an ion implantation region;
    implanting impurities in the ion implantation region of the material layer using the photoresist pattern as an ion implantation barrier; and
    removing the photoresist pattern using plasma of a gas mixture including diimide (N$_2$H$_2$), the removing the photoresist pattern comprising:
        performing a first step at a first temperature using plasma of N$_2$H$_2$ and oxygen (O$_2$), wherein a ratio of the N$_2$H$_2$ to the O$_2$ ranges approximately 4-6:1;
        performing a second step, using plasma of N$_2$H$_2$ and O$_2$, at a second temperature higher than the first temperature; and
        performing a third step using plasma of N$_2$H$_2$ alone.

2. The method of claim 1, wherein the first temperature ranges from approximately 100° C. to approximately 160° C. in the first step and the second temperature ranges from approximately 200° C. to approximately 250° C. in the second step.

3. The method of claim 1, wherein the N$_2$H$_2$ gas comprises approximately 4% of H$_2$ and approximately 96% of N$_2$ in the first step to the third step.

4. The method of claim 1, wherein the ratio of the N$_2$H$_2$ to the O$_2$ for the second step ranges approximately 4-6:1.

5. The method of claim 1, wherein microwave and radio frequency (RF) bias are simultaneously used to generate the plasma in the first step to the third step.

6. The method of claim 5, further comprising, after implanting the impurities, performing a rinse treatment on the material layer using a solution including deionized water.

7. The method of claim 6, wherein performing the rinse treatment comprises using a mixed solution including deionized water and ozone.

8. The method of claim 7, wherein a temperature of the mixed solution including deionized water and ozone ranges from approximately 25° C. to approximately 80° C.

9. The method of claim 8, wherein a concentration level of the ozone included in the mixed solution ranges from approximately 1 ppm to approximately 500 ppm.

10. The method of claim 1, wherein the material layer comprises a polysilicon layer.

11. The method of claim 10, wherein the impurities comprise one selected from a group consisting of arsenic (A), phosphorus (P), boron (B), and a combination thereof.

12. The method of claim 11, wherein implanting the impurities comprises performing one of a beam line ion implantation and a plasma doping.

13. A method, comprising:
    forming a first photoresist pattern over a polysilicon layer, the first photoresist pattern exposing a first portion of the polysilicon layer;
    implanting first impurities into the first portion of the polysilicon layer using the first photoresist pattern as an ion implantation barrier;
    removing the first photoresist pattern using plasma of a gas mixture including diimide (N$_2$H$_2$);
    forming a second photoresist pattern over the polysilicon layer, the second photoresist pattern exposing a second portion of the polysilicon layer other than the first portion;
    implanting second impurities into the second portion of the polysilicon layer using the second photoresist pattern as an ion implantation barrier; and
    removing the second photoresist pattern using plasma of a gas mixture including N$_2$H$_2$, the removing the second photoresist pattern comprising:
        performing a first step at a first temperature using plasma of N$_2$H$_2$ and oxygen (O$_2$), wherein a ratio of the N$_2$H$_2$ to the O$_2$ ranges approximately 4-6:1;
        performing a second step, using plasma of a gas including N$_2$H$_2$ and O$_2$, at a second temperature higher than the first temperature; and
        performing a third step using plasma of N$_2$H$_2$ alone.

14. The method of claim 13, wherein the first temperature ranges from approximately 100° C. to approximately 160° C. in the first step and the second temperature ranges from approximately 200° C. to approximately 250° C. in the second step.

15. The method of claim 13, wherein the $N_2H_2$ gas comprises approximately 4% of $H_2$ and approximately 96% of $N_2$ in the first step to the third step.

16. The method of claim 13, wherein the ratio of the $N_2H_2$ to the $O_2$ for the second step ranges approximately 4-6:1.

17. The method of claim 13, wherein microwave and radio frequency (RF) bias are simultaneously used to generate the plasma in the first step to the third step.

18. The method of claim 13, further comprising, after each of implanting the first impurities and implanting the second impurities, performing a rinse treatment on the polysilicon layer using a solution including deionized water.

19. The method of claim 18, wherein performing the rinse treatment comprises using a mixed solution including deionized water and ozone.

20. The method of claim 19, wherein a temperature of the mixed solution including deionized water and ozone ranges from approximately 25° C. to approximately 80° C.

21. The method of claim 20, wherein a concentration level of the ozone included in the mixed solution ranges from approximately 1 ppm to approximately 500 ppm.

22. The method of claim 13, wherein the first impurities comprise N-type impurities and the second impurities comprise P-type impurities.

23. The method of claim 13, wherein the first impurities comprise P-type impurities and the second impurities comprise N-type impurities.

24. The method of claim 22, wherein implanting the first and the second impurities comprises performing one of a beam line ion implantation and a plasma doping.

* * * * *